US009528667B1

(12) United States Patent
Pereyra

(10) Patent No.: US 9,528,667 B1
(45) Date of Patent: Dec. 27, 2016

(54) THERMOFORMING A SUBSTRATE BEARING LEDS INTO A CURVED BULB ENCLOSURE

(71) Applicant: Rodrigo M. Pereyra, Salem, MA (US)

(72) Inventor: Rodrigo M. Pereyra, Salem, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 5 days.

(21) Appl. No.: 14/844,796

(22) Filed: Sep. 3, 2015

(51) Int. Cl.
*F21V 23/00* (2015.01)
*F21K 99/00* (2016.01)
*H05K 3/00* (2006.01)

(52) U.S. Cl.
CPC ............... *F21K 9/90* (2013.01); *F21V 23/005* (2013.01); *H05K 3/0014* (2013.01)

(58) Field of Classification Search
CPC .................... F21K 9/90; H05K 3/0014; H05K 2203/13–2203/1327
See application file for complete search history.

(56) References Cited

U.S. PATENT DOCUMENTS

| | | |
|---|---|---|
| 5,585,783 A | 12/1996 | Hall |
| 5,838,247 A | 11/1998 | Bladowski |
| 5,960,942 A | 10/1999 | Thornton |
| 6,092,915 A | 7/2000 | Rensch |
| 6,580,228 B1 | 6/2003 | Chen et al. |
| 6,643,304 B1 | 11/2003 | Chen et al. |
| 6,656,611 B2 | 12/2003 | Tai et al. |
| 6,709,132 B2 | 3/2004 | Ishibashi |
| 6,860,621 B2 | 3/2005 | Bachl et al. |
| 7,086,756 B2 | 8/2006 | Maxik |
| 7,086,767 B2 | 8/2006 | Sidwell et al. |
| 7,340,830 B2 * | 3/2008 | Liu ............................ F21K 9/00 29/829 |
| 7,726,836 B2 | 6/2010 | Chen |
| 7,736,020 B2 | 6/2010 | Baroky et al. |
| 7,862,220 B2 | 1/2011 | Cannon et al. |

(Continued)

FOREIGN PATENT DOCUMENTS

JP        2000269549          9/2000

OTHER PUBLICATIONS

Patent Abstract of above Japanese Publication No. 2000-269549, published Sep. 29, 2000, available from EPO Espacenet database (1 page).

(Continued)

*Primary Examiner* — Mariceli Santiago
(74) *Attorney, Agent, or Firm* — Edward S. Podszus

(57) ABSTRACT

A method of manufacturing a lamp comprising forming a first sheet segment (48) into a first shell portion (110) after forming a first electrically conductive trace (70) on the first sheet segment (48) and after placing a first plurality of LEDs (90) on the first sheet segment (48); forming a second sheet segment (50) into a second shell portion (120) after forming a second electrically conductive trace (80) on the second plastic segment (50) and after placing a second plurality of LEDs (90) on the second sheet segment (50); and joining the first shell portion (110) and the second shell portion (120) into a bulb enclosure (40) defining an interior region (42) therein. The first and second sheet segments (48, 50) are preferably thermoformed and may be connected by a web (60).

20 Claims, 12 Drawing Sheets

(56) References Cited

U.S. PATENT DOCUMENTS

| | | | |
|---|---|---|---|
| 8,013,501 B2* | 9/2011 | Carroll | F21K 9/135 |
| | | | 313/46 |
| 8,314,566 B2 | 11/2012 | Steele et al. | |
| 8,860,289 B2 | 10/2014 | Carroll et al. | |
| 8,883,287 B2 | 11/2014 | Boyce et al. | |
| 8,998,444 B2 | 4/2015 | Roberts et al. | |
| 9,048,396 B2 | 6/2015 | Lowes et al. | |
| 2002/0021086 A1 | 2/2002 | Czak | |
| 2004/0114367 A1* | 6/2004 | Li | F21K 9/232 |
| | | | 362/248 |
| 2005/0174769 A1 | 8/2005 | Yong et al. | |
| 2007/0291482 A1* | 12/2007 | Baroky | F21K 9/232 |
| | | | 362/227 |
| 2010/0213486 A1 | 8/2010 | Shi | |
| 2011/0163683 A1* | 7/2011 | Steele | F21V 7/00 |
| | | | 315/192 |
| 2012/0106153 A1* | 5/2012 | Huang | F21K 9/232 |
| | | | 362/249.02 |
| 2014/0022789 A1* | 1/2014 | Lin | F21K 9/90 |
| | | | 362/249.02 |
| 2014/0292176 A1 | 10/2014 | Athalye | |
| 2016/0003463 A1* | 1/2016 | Rodinger | F21K 9/23 |
| | | | 362/249.02 |

OTHER PUBLICATIONS

Machine translation of above JP 2000-269549, available on EPO website Aug. 7, 2015 (14 pages).

* cited by examiner

US 9,528,667 B1

THERMOFORMING A SUBSTRATE BEARING LEDS INTO A CURVED BULB ENCLOSURE

CROSS REFERENCE TO RELATED APPLICATIONS

N/A

TECHNICAL FIELD

The present disclosure relates to a solid-state lighting device, particularly in a form of a lamp comprising a bulb enclosure, wherein the bulb enclosure provides a substrate for at least one electrically conductive trace and a plurality of light-emitting diodes (including LED chips) located thereon. The lamp may include a lamp base configured such that the lamp may be particularly used as a retrofit lamp for a conventional incandescent lamp fixture.

BACKGROUND

A conventional incandescent lamp comprises a glass bulb enclosure joined to a lamp base, with a light emitting structure including a filament extending from the base into the interior volume of the bulb enclosure.

In order to save energy, as well as increase lighting performance, many incandescent lamps are being replaced by solid state lighting devices, particularly solid state lighting devices comprising light-emitting diodes (LEDs).

It is known to provide a lamp having LED's mounted on a bent printed circuit board (PCB), and then covering the LEDs and the PCB with a separate bulb enclosure. See, for example, U.S. Pat. No. 7,086,767 (Sidwell). In this instance, the LED substrate, i.e. printed circuit board, and bulb enclosure may be understood as being two distinct members, which adds complexity, weight and cost to a lamp.

The following illumination devices are also known: U.S. Pat. No. 5,585,783 (Hall); U.S. Pat. No. 5,838,247 (Bladowski); U.S. Pat. No. 5,960,942 (Thorton); U.S. Pat. No. 6,580,228 (Chen); U.S. Pat. No. 6,709,132 (Ishibashi); U.S. Pat. No. 7,086,756 (Maxik); U.S. Pat. No. 8,314,566 (Steele); U.S. Pat. No. 8,860,289 (Carroll); U.S. Pat. No. 8,883,287 (Boyce); U.S. Pat. App. Pub. 2005/0174769 (Yong) and U.S. Pat. App. Pub. 2014/0292176 (Athalye).

U.S. Pat. No. 7,862,220 (Cannon) discloses, at col. 5 ln. 45-col. 6, ln. 5, a molded backlit dome light (FIGS. 2a-d) in which LEDs 24 having wiring harness 22 are present on a peripheral annular border 21 of printed device 20a within whose interior region a diffusor is present and which interior diffusor region is vacuum molded (FIG. 2b) into a dome region whereas the LEDs and wiring appear to remain planar since border 21 is further integrated into a rigid bezel by its being overmolded with plastic introduced through anchoring holes 26.

U.S. Pat. No. 7,736,020 (Baroky) discloses a method of making a bulbous substrate to whose exterior surface the LEDs 102 are mounted only after having formed the bulbous substrate.

BRIEF DESCRIPTION OF THE DRAWINGS

Reference should be made to the following detailed description, read in conjunction with the following figures, wherein like numerals represent like parts.

SUMMARY

In at least one embodiment, the present disclosure provides a retrofit LED lamp, which may be particularly configured to be powered by being electrically coupled with a conventional socket of a lamp fixture which also accommodates an incandescent lamp.

The retrofit lamp of the present disclosure makes use of the bulb enclosure as an LED substrate. The bulb enclosure/LED substrate may be manufactured from at least one sheet of plastics material. To form the bulb enclosure, the sheet may be formed from a two-dimensional (planar) shape into a three-dimensional shape corresponding to the contour of the bulb enclosure. Since the bulb enclosure forms the outer most exterior surface, the lamp is formed without an outer covering dome.

As will be made more apparent herein, the use of such a sheet to provide an LED substrate may reduce the cost of the lamp by eliminating use of the conventional rigid, planar printed circuit board which conventionally functions as a substrate for the LED(s), as well as eliminate other components such as the heat sink. In addition, as disclosed herein, the forming process for the bulb enclosure may be readily applied to a number of different bulb geometries (A-series lamp, etc.), and the position of the LEDs may provide optical benefits to achieve omnidirectionality of the lighting, which may support compliance with energy regulations (e.g. Energy Star).

A method of manufacturing a lamp is provided, which comprises forming a first sheet segment into a first shell portion after forming at least one first electrically conductive trace on the first sheet segment and after placing a first plurality of LEDs on the first sheet segment; forming a second sheet segment into a second shell portion after forming at least one second electrically conductive trace on the second plastic segment and after placing a second plurality of LEDs on the second sheet segment; and joining the first shell portion and the second shell portion into a bulb enclosure defining an interior region therein. The sheet segments are preferably thermoformed.

DETAILED DESCRIPTION INCLUDING BEST MODE OF A PREFERRED EMBODIMENT

For a thorough understanding of the present disclosure, reference is made to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient. Also, it should be understood that the phraseology and terminology used herein is for the purpose of description and should not be regarded as limiting.

Figure 1:
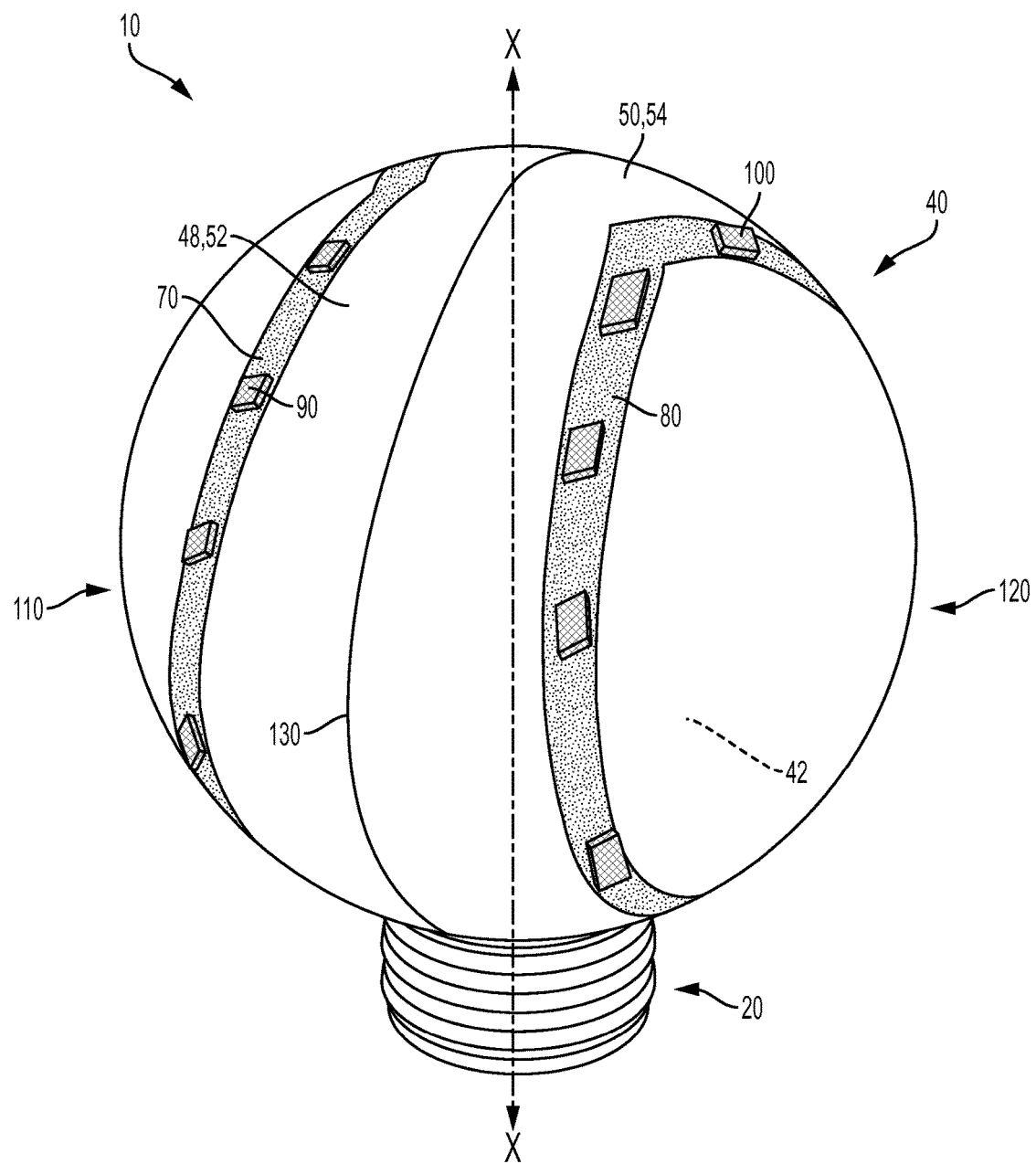
FIG. 1 shows a perspective view of a solid-state lighting devices particularly in form of a lamp (including a bulb enclosure and lamp base) according to the present disclosure.

With reference to the figures, and particularly FIG. 1, the present disclosure provides solid-state lighting devices particularly in form of a lamp 10, and more particularly, methods of manufacturing the lamp 10.

As shown, lamp 10 comprises an electrically conductive lamp base 20 and an optically transmissive bulb enclosure 40, which may also be a light diffuser, which defines an interior (volume) region 42 thereof. The lamp 10 may be particularly configured as a retrofit lamp for a lamp socket, such as a conventional incandescent lamp socket.

More particularly, lamp 10 has an enclosure 40 with a shape which simulates or otherwise corresponds to an A-series lamp, and be particularly configured as a retrofit lamp for the A-series lamp, particularly an A19 lamp. As may be understood in the art, the shape of a "pear shaped" A-series lamp, and particularly an A19 lamp, is specified in American National Standards Institute (ANSI) C78.20-2003. The ANSI standard establishes, through diagram, a spatial envelope that a lamp cannot exceed in order to still be considered "A-series" and thus fit in standard industry lamp fixtures.

With regards to size of an A-series enclosure, the number appearing after the letter indicates the enclosure size (maximum lamp diameter) and is expressed by a number representing eighths of an inch (English) or millimeters (metric). Thus, an "A19" lamp may be understood to have 19 eights of an inch, which converts to a maximum diameter is 2⅜ inches, while an "A60" lamp (the metric equivalent of the "A19" lamp) may be understood to have a maximum diameter of 60 millimeters.

In addition to diameter, the ANSI standard sets forth (ANSI C.78-20-206) that an A19 lamp has a minimum length of 90.5 millimeters and a maximum length of 100 millimeters, and an electrically conductive medium screw (Edison) base E26/E24.

With regards to variants, lamp 10 may also be manufactured in another form to simulate other A-series lamps, such as A15, A17, A19, A21 and A23. In still other variants, lamp 10 may be any type of lamp which may fit an incandescent lamp socket. For example, lamp 10 may have a form of a B-lamp, C-lamp, CA-lamp, E-lamp, F-lamp, G-lamp, H-lamp, P-lamp, PS-lamp, S-lamp, T-lamp, R-lamp, BR-lamp, ER-lamp or PAR-lamp. As such, the lamp base 20 may also be any type of base which may fit incandescent lamp socket. For example, base 20 may be any of the other sizes of screw bases, which may include candelabra (e.g. E11, E12), intermediate (e.g. E14, E17), medium/standard (e.g. E26, E27) or mogul (e.g. E39, E40). Base 20 may also be a bayonet base (e.g. BA7S, BA9S, BA15S, BAY15S, BA15D, BAY15D, BA22D).

Figure 2:
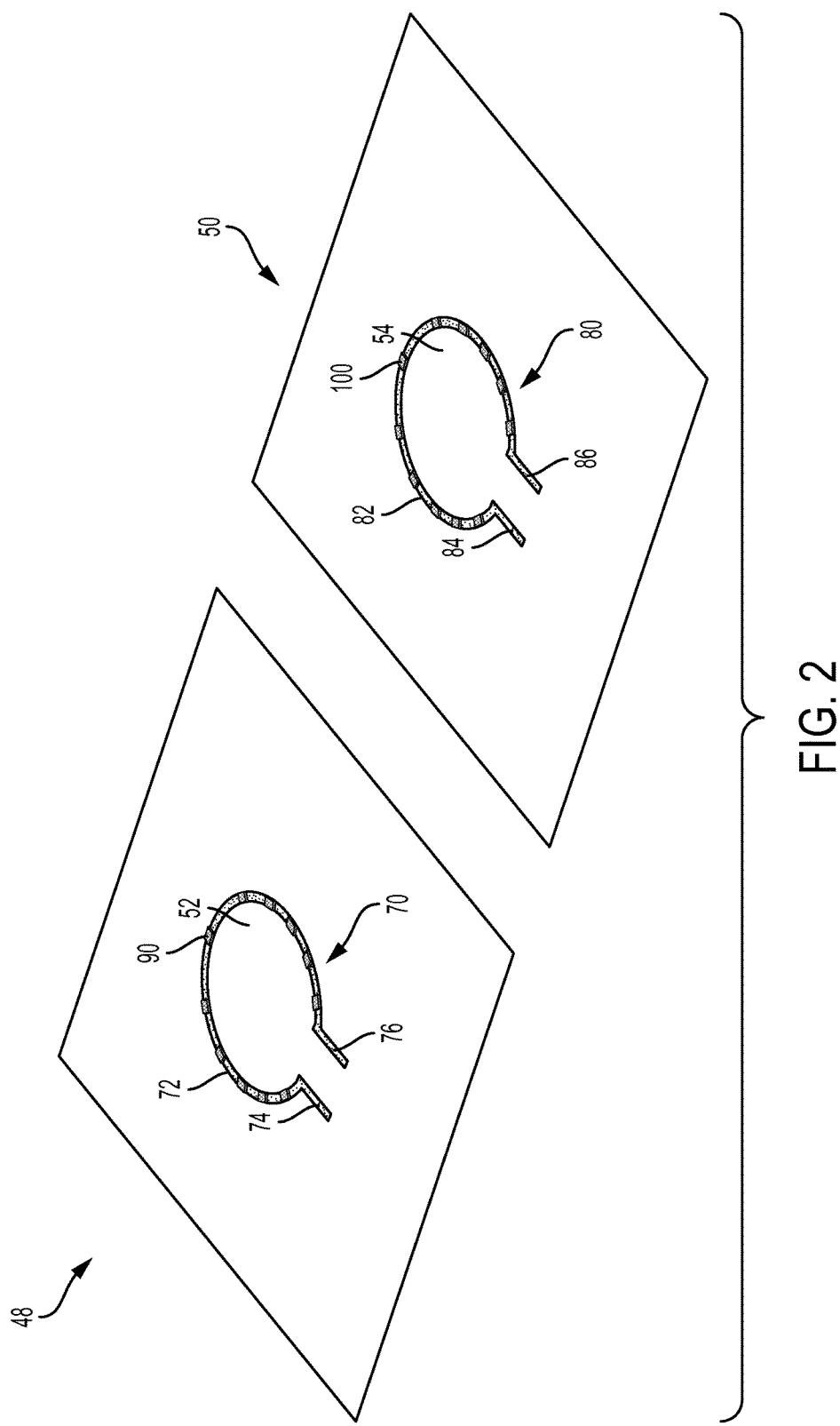
FIG. 2 shows a perspective view of two sheet segments provided by separate sheets of plastics material, with electrically conductive traces and LEDs located thereon, to be used to provide the bulb enclosure of FIG. 1.
Figure 3:
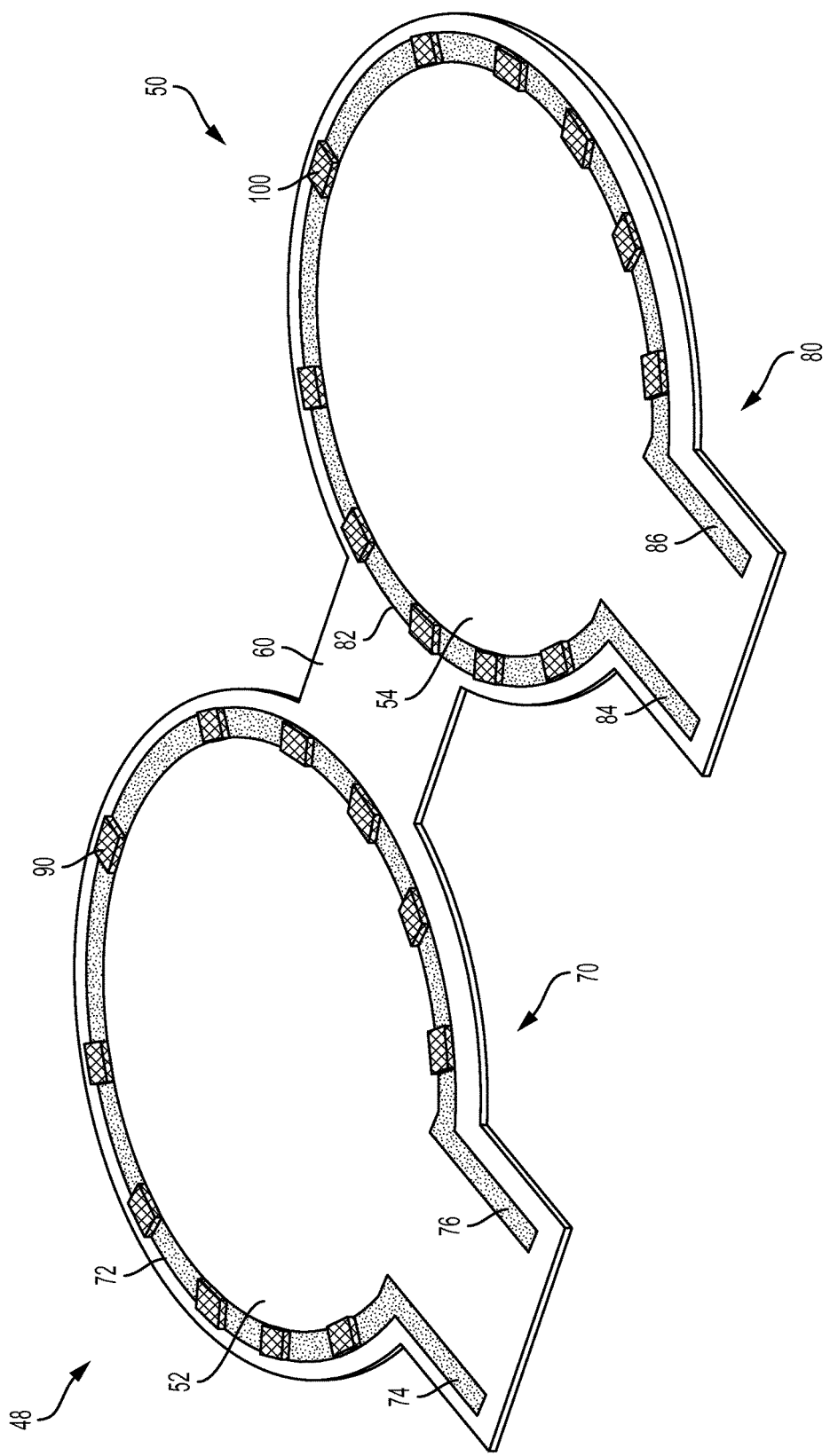
FIG. 3 shows a perspective view of two sheet segments provided by a single sheet of plastics material, with electrically conductive traces and LEDs located thereon, to be used to provide the bulb enclosure of FIG. 1.
Figure 4:
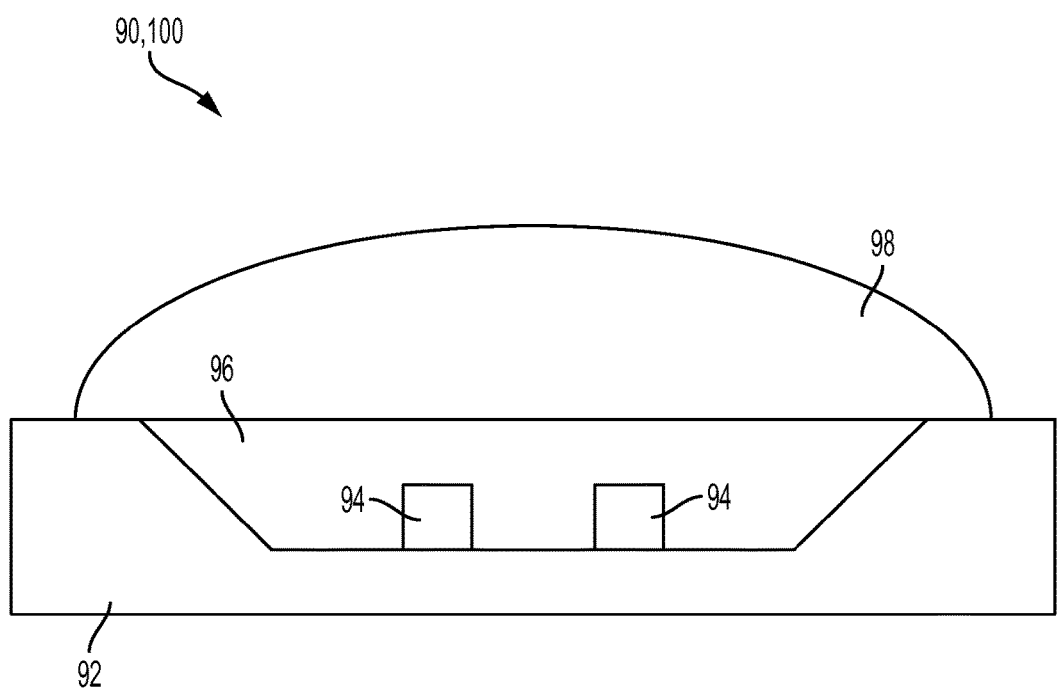
FIG. 4 is an enlarged side view of a prior art LED shown in FIG. 2 or FIG. 3.

With particular reference to FIGS. 2-4, bulb enclosure 40 is formed from at least two sheet segments, which are shown as first sheet segment 48 and second sheet segment 50. Each sheet segment 48, 50 is formed of a plastics material which is electrically non-conductive.

First sheet segment 48 and second sheet segment 50 may each be formed from a roll of sheetstock which is formed by extrusion, and thus an extrudate. First sheet segment 48 and second sheet segment 50 may each be formed of the same plastics material composition, which may comprise one or more polymers, particularly one or more thermoplastic polymers. The one or more thermoplastic polymers may each be, for example, thermoplastic homopolymers, copolymers and/or terpolymers.

First sheet segment 48 and second sheet segment 50 may be particularly formed of polyester, particularly polyethylene terephthalate, also referred to as poly(ethylene terephthalate) or simply by the acronym PET. PET is a copolymer of ethylene glycol and one or more dimethyl terephthalates or terephthalic acids. Preferably, first sheet segment 48 and second sheet segment 50 each comprise at least 80% by weight PET, and more particularly at least 90% PET.

First sheet segment 48 and second sheet segment 50 may comprise one or more layers of plastics material, and have an overall thickness in a range of 0.125 mm to 1.5 mm.

In FIGS. 2-3, first sheet segment 48 and second sheet segment 50 are shown in planar form after being taken from a roll of sheetstock and prior to being shaped into bulb enclosure 40. FIG. 2 shows that first sheet segment 48 and second sheet segment 50 may be initially in a form of two separate sheets of plastics material. Alternatively, as shown in FIG. 3, first sheet segment 48 and second sheet segment 50 may each be a segment of a single piece of plastics material which are connected by an intermediate connecting web 60 which may provide a hinge as discussed later herein.

As shown in FIGS. 2-3, first sheet segment 48 and second sheet segment 50 may be substantially identical, with outer surfaces 52, 54 and inner surfaces 56, 58 (shown in FIG. 9), respectively. Each of first sheet segment 48 and second sheet segment 50 provides a flexible (bendable/stretchable) substrate onto which one or more electrically conductive traces 70, 80 may be formed thereon which provide part of an electrical circuit to light the lamp 10. As shown, first electrically conductive trace 70 is formed on the outer surface 52 of the first sheet segment 48, while second electrically conductive trace 80 is formed on the outer surface 54 of the second sheet segment 50. There is at least one electrically conductive trace on each sheet segment 48, 50.

Each electrically conductive trace 70, 80 is formed of an electrically conductive material. For example, each trace 70, 80 may also be formed of (comprising, consisting essentially of or consisting of) an electrically conductive plastics material, such as by laminating, screen printing or three-dimensional printing, or an electrically conductive metal, such as copper by etching.

The electrically conductive plastics material may comprise electrically conductive particles (e.g. metal, carbon black) disposed in a polymer matrix. The polymer matrix may comprise one or more polymers which may be electrically non-conductive or electrically conductive, in which case the electrically conductive particles may be eliminated. The polymer matrix may be selected from one or more polymers which exhibit good bonding properties to the plastics material of the first sheet segment 48 and second sheet segment 50.

As shown, each trace 70, 80 comprises a preferably substantially circular (annular ring) head portion 72, 82 which is connected to two substantially parallel linear neck portions or legs 74, 76 and 84, 86 at each end thereof, respectively.

On each of first and second sheet segments 48, 50 are also mounted or otherwise placed a plurality of solid-state light sources 90, 100, respectively. The solid-state light sources 90, 100 are positioned such that they establish electrical communication with each of traces 70, 80, respectively.

Each solid-state light sources 90, 100 comprises a packaged light-emitting diode (LED), which, when coupled to a driver (not shown), provides an LED light engine. As shown, each trace 70, 80 respectively connects the LEDs 90, 100 located thereon in series. However, the LEDs 90, 100 may also be electrically connected in parallel, or in series/parallel.

There is shown in FIG. 4 a conventional packaged light-emitting diode (LED) of the prior art which includes an LED chip 94 mounted in a substrate, such as a lead frame. As shown in FIG. 4, it is known in the art that LEDs each comprise a submount 92 on which one or more LED chips 94 are mounted. LEDs are soldered to traces 70, 80.

As discussed in U.S. Pat. No. 8,998,444 (Roberts), the submount 92 may include electrical traces, wirebond pads, leads, and/or other features that permit the LED chips 94 to be mounted thereon and electrically activated. The submount 92 may also include a heat sink (not shown). An optical encapsulant 96 may surround and protect the LED chips 94 within a cavity defined in, on or by the submount 92. The encapsulant material 96 may enhance coupling of light emission out of the LED chips 94 for better extraction from the package. An optional lens 98 may be mounted on the submount 92 above the LED chips 94 to provide a desired near or far field emission pattern from the package. One or more phosphor materials can be provided within the package to convert some or all light emitted by one or more of the LED chips 94.

As shown in FIGS. 1-3, the LEDs 90, 100 may be arranged to provide multi-directional illumination similar to that of a conventional incandescent lamp. For example, LEDs 90, 100 may be arranged to provide light approximately 360 degrees around a longitudinal axis X-X (see FIG. 1) of the lamp 10.

Figure 9:
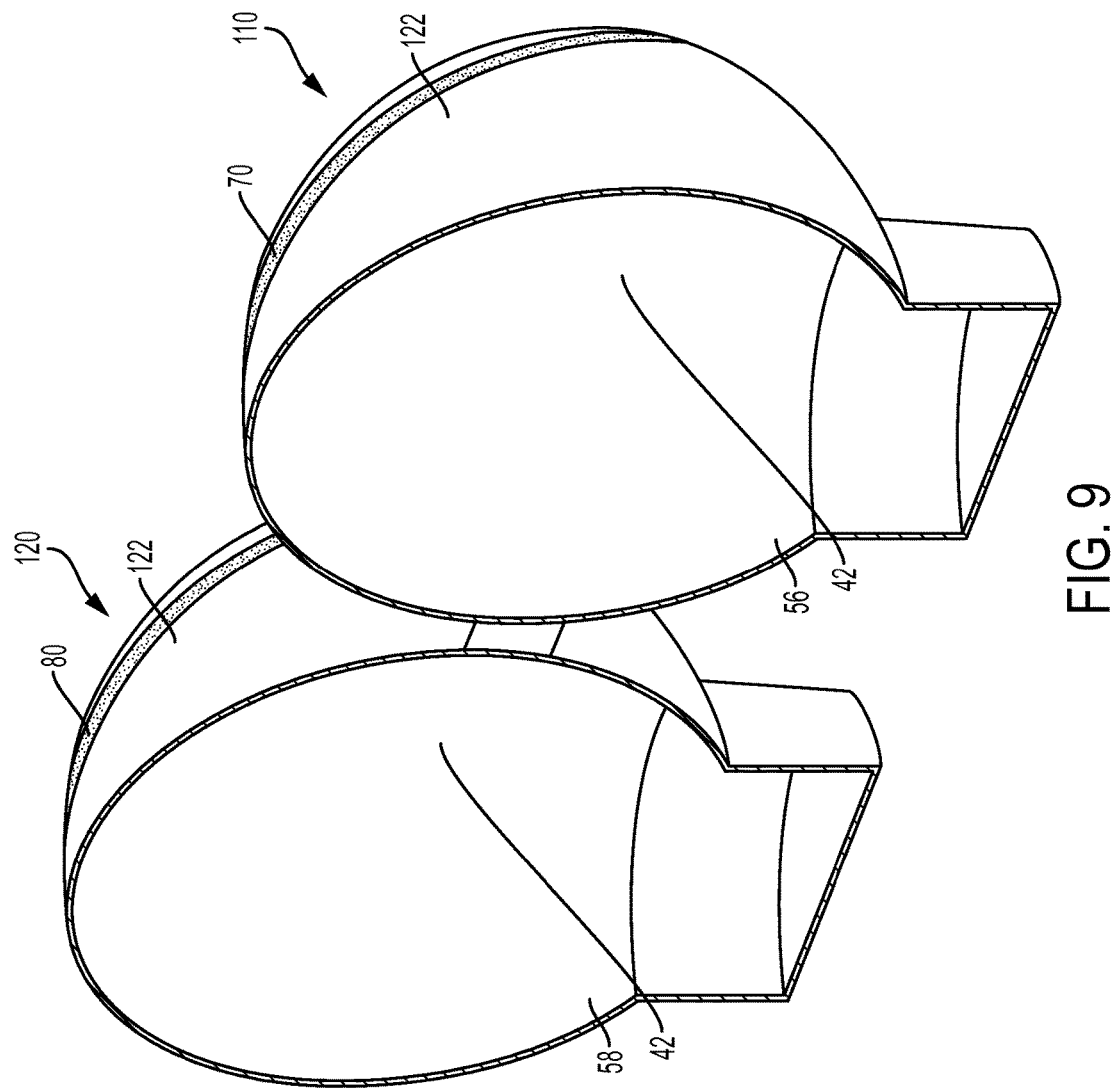
FIG. 9 shows a perspective view of an inner contour of the sheet segments after being formed into shell portions used to form the bulb enclosure of FIG. 1.
Figure 10:
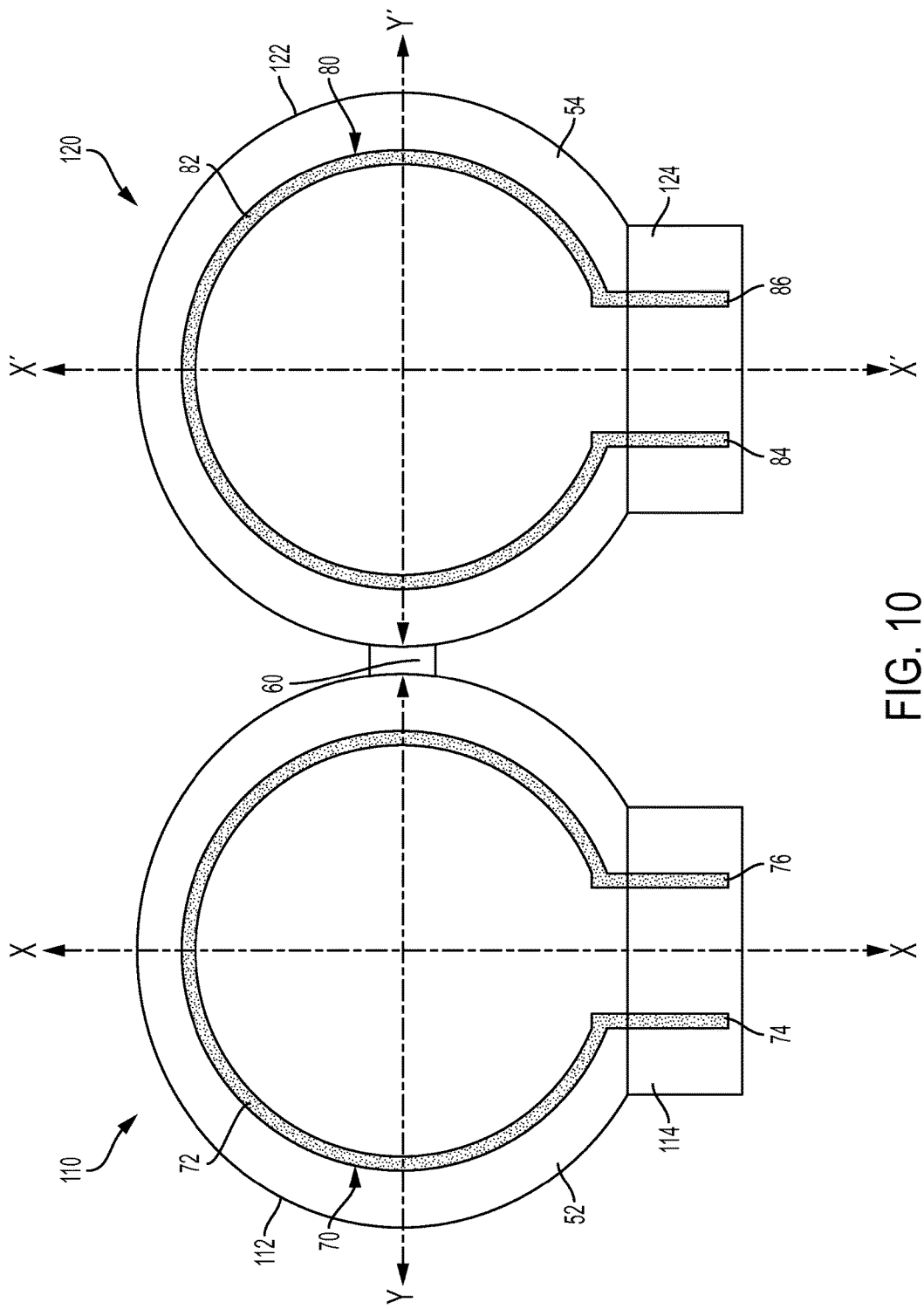
FIG. 10 shows a side view of an outer contour of the sheet segments after being formed into shell portions used to form the bulb enclosure of FIG. 1.

Briefly referring to FIGS. 9-10, after forming each trace 70, 90 on the first and second sheet segments 48, 50, respectively, as well as after placing the first and second pluralities of solid-state light sources 90, 100 on the first and second sheet segments 48, 50, respectively, first sheet segment 48 and second sheet segment 50 may be formed into first and second shell portions 110, 120, respectively. More particularly, first sheet segment 48 and second sheet segment 50 may be formed into a first half shell portion 110 and a second half shell portion 120, respectively. Thereafter, first shell portion 110 and a second shell portion 120 may be formed into bulb enclosure 40 as shown in FIG. 1.

First sheet segment 48 and second sheet segment 50 may be formed into a first shell portion 110 and a second shell portion 120, respectively, via thermoforming, which may include vacuum forming assist or pressure forming assist.

Figure 5:
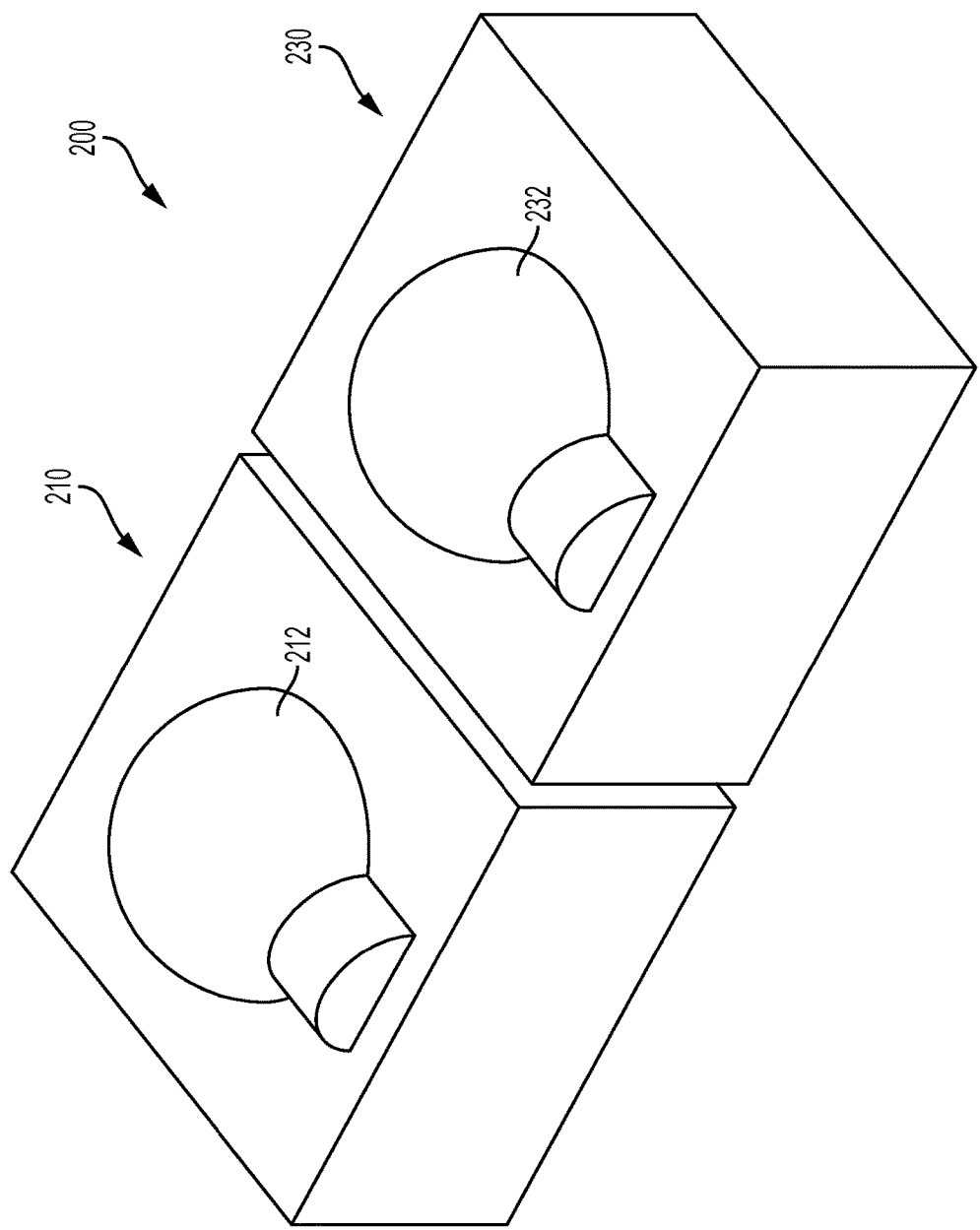
FIG. 5 shows a perspective view of a male forming mold which may be used to form the sheet segments of FIG. 2 or FIG. 3 into shell portions of the bulb enclosure of FIG. 1.
Figure 6:
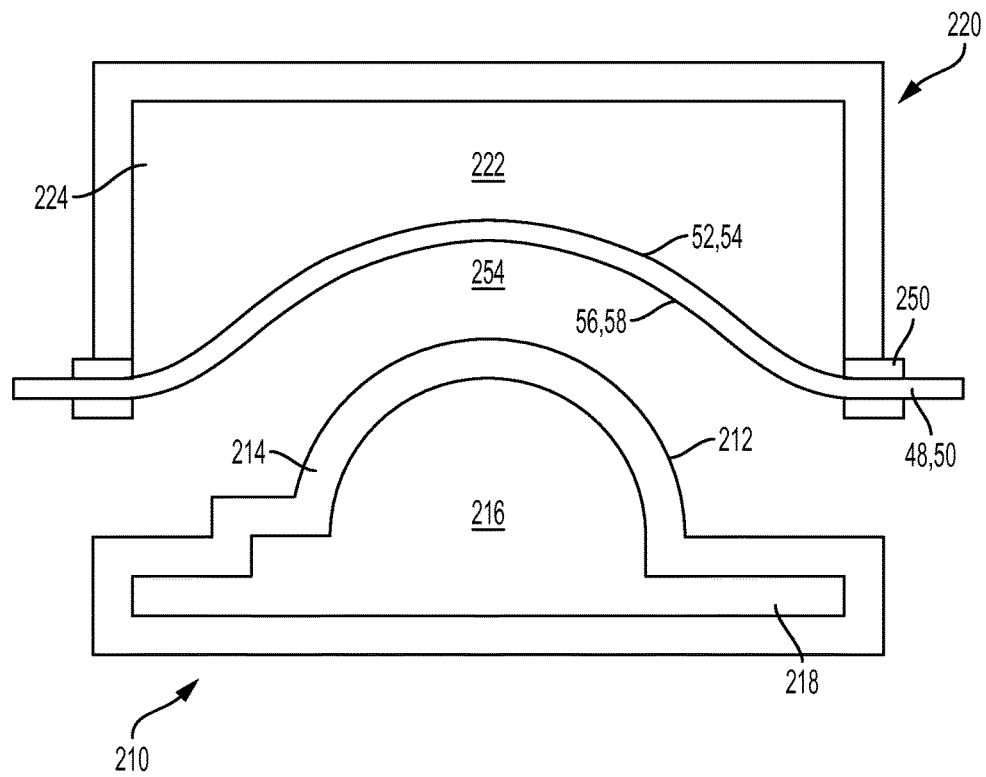
FIG. 6 shows a side view of a sheet segment of FIG. 2 and the male forming mold of FIG. 5 before the sheet segment is formed into a shell portion of the bulb enclosure of FIG. 1.
Figure 7:
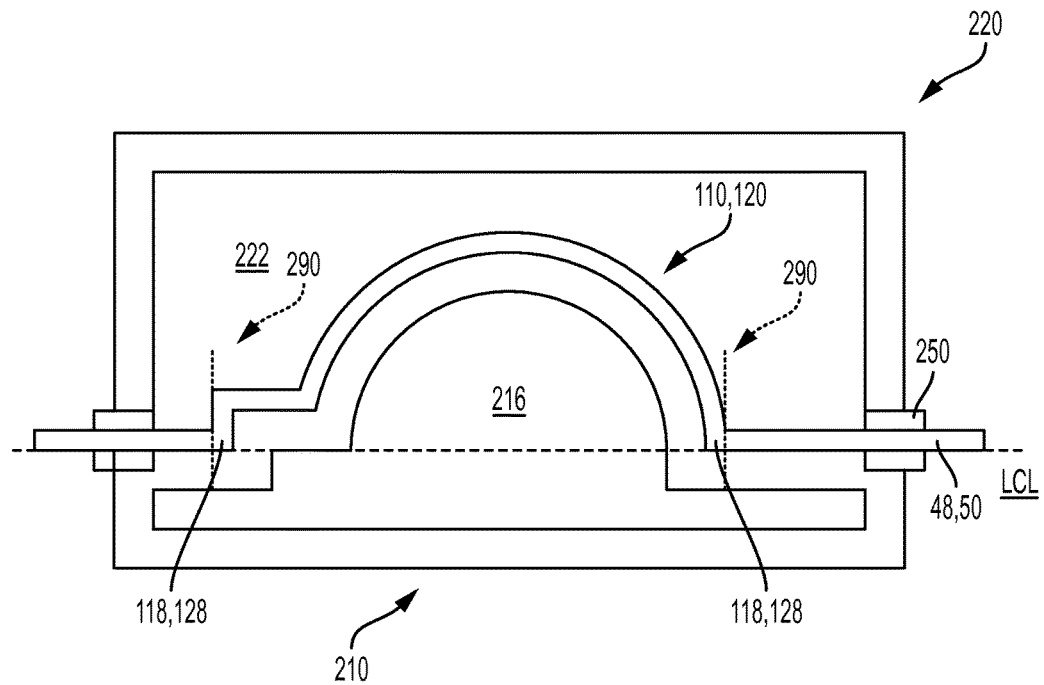
FIG. 7 shows a side view of a sheet segment of FIG. 2 and the male forming mold of FIG. 5 after the sheet segment is formed into a shell portion of the bulb enclosure of FIG. 1.

Referring now to FIGS. 5-7, in order to form first sheet segment 48 and second sheet segment 50 into first shell portion 110 and second shell portion 120, respectively, of bulb enclosure 40, each of first sheet segment 48 and second sheet segment 50 may be formed on a male forming mandrel 210, 230 of a mold 200, which may also be understood to be a mold core. Each forming mandrel 210, 230 has a forming surface 212, 232 to form first shell portion 110 and second shell portion 120, respectively. Forming surfaces 212, 232 are substantially duplicative of the inner surfaces 56, 58 of the first shell portion 110 and second shell portion 120, respectively, as shown in FIG. 9.

Referring more particularly to FIGS. 6-7, the mandrels 210, 230 (mandrel 230 not shown as being repetitive) may comprise an air porous hollow mandrel body 214 having an internal chamber 216 therein which is coupled to a vacuum source 218. Mold 200 may further comprise a female forming box 220, which includes a forming cavity 222 coupled to a vacuum and/or pressure source 224. While not shown, it should understood that forming mandrel 230 further comprises all the components of forming mandrel 210, as well as a female pre-forming box. It should also be understood that while two forming mandrels 210, 230 may be particularly used when first sheet segment 48 and second sheet segment 50 may each be a segment of a single piece of sheet material which are connected by an intermediate connecting web 60 (FIG. 3), only a single forming mandrel may be required when first sheet segment 48 and second sheet segment 50 may be initially in a form of two separate sheets of plastics material (FIG. 3) and the resulting first shell portion 110 and second shell portion 120 are substantially identical.

In order to form first and second shell portions 110, 120 of bulb enclosure 40, first and/or second sheet segment 48, 50 may be loaded into a clamping frame 250 and heated to a suitable thermoforming temperature. After heating, the clamping frame 250 may seal against a perimeter edge of the female forming box 220. Once sealed, vacuum may be applied to cavity 222 of forming box 220 from vacuum source 224, which pre-stretches the first sheet and/or second segment 48, 50 by pulling (drawing) it into cavity 222.

Referring to FIG. 7, when the first sheet and/or second segment 48, 50 has been pre-stretched to the desired pre-forming level, the male mandrel 210 enters into a recess 254 formed in the first sheet and/or second segment 48, 50 and seals to the clamping frame 250. Vacuum is then applied at mandrel forming surface 212 from cavity 216 and vacuum source 218, while simultaneously the cavity 222 of forming box 220 is allowed to vent to the atmosphere (or low pressure is applied in place of the vacuum from pressure source 224).

In the foregoing manner, first and second sheet segments 48, 50 are formed into first and second shell portions 110, 120 of bulb enclosure 40, either simultaneously (with two forming mandrels 210, 230) or sequentially (with one forming mandrel 210).

With forming the first and second shell portions 110, 120 in the above manner, undesirable thinning of the first and second sheet segments 48, 50 at localized locations may be reduced, and the amount of stretching of the first and second sheet segments 48, 50 may be more evenly distributed throughout the whole first and second sheet segments 48, 50.

Furthermore, as shown, first and second sheet segments 48, 50 are orientated with the outer surfaces 52, 54, respectively, facing cavity 222. As such, during forming, neither of the traces 70, 80 or the LEDs 90, 110 make direct contact with a mold forming surface, which could possibly damage such. Once suitably cooled, the resultant first and second shell portions 110, 120 may be trimmed along dotted trim line 290 to provide peripheral edge portions 118, 128 for subsequent joining.

Figure 8:
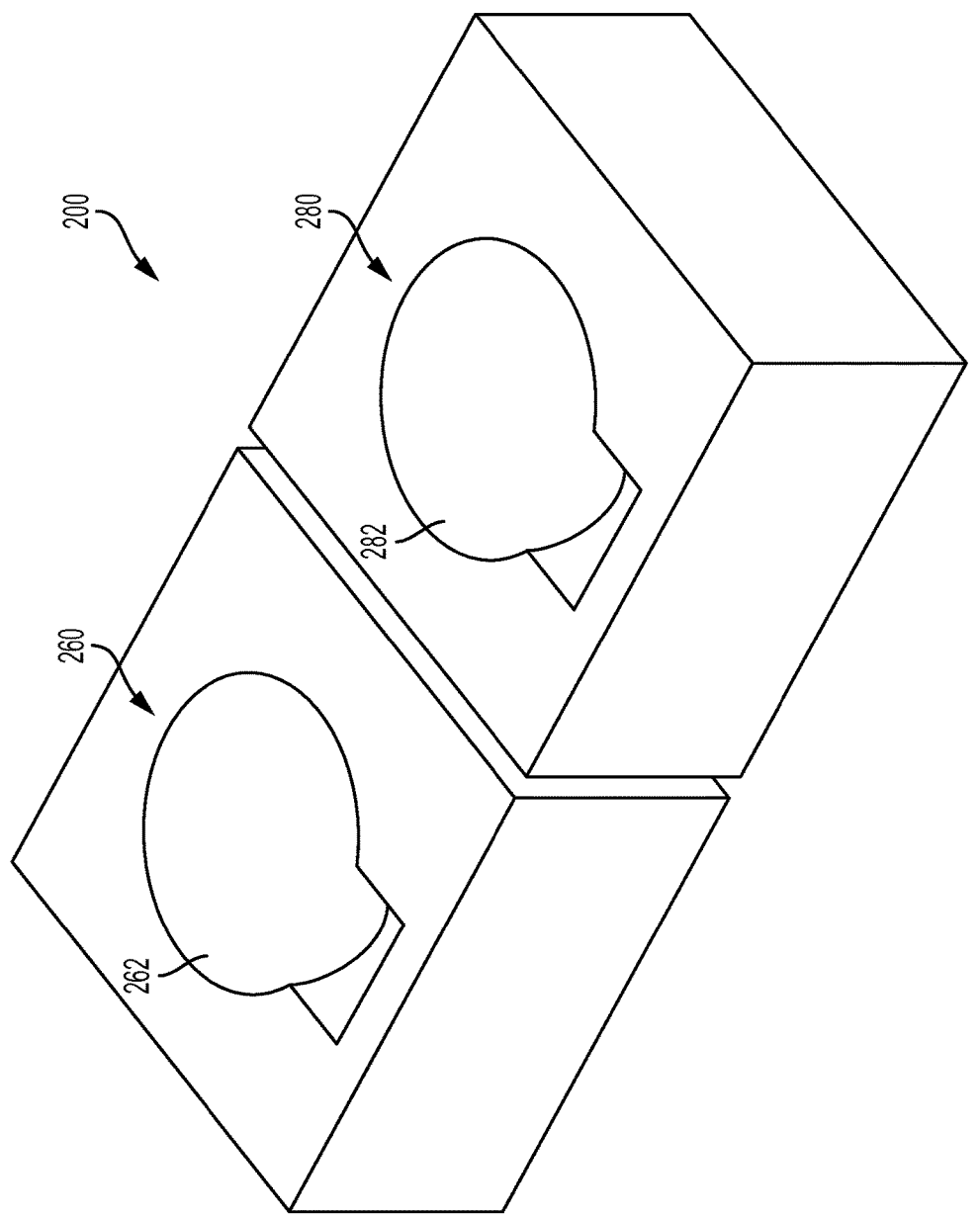
FIG. 8 shows a perspective view of a female forming mold which may be used to form the sheet segments of FIG. 2 or FIG. 3 into shell portions of the bulb enclosure of FIG. 1.

While the foregoing manufacturing method describes the use of male thermoforming, which may be vacuum and pressure assisted, female thermoforming may also be used as an alternative, to male thermoforming. Referring to FIG. 8, there is shown a female thermoforming/vacuum forming cavities 260, 280 having cavity forming surfaces 262, 282 which substantially duplicate outer surfaces 52, 54 of first and second shell portions 110, 120.

Female thermoforming may become more desirable if the forming surface of the female form is not found to damage either the traces 70, 80 or the LEDs 90, 100 when formed there against. Female thermoforming may also become more desirable if it becomes desirable to place traces 70, 80 or the LEDs 90, 100 on the inner surfaces 56, 58 of first and second sheet segments 48, 50 and the subsequent first and second shell portions 110, 120.

Referring now to FIGS. 9-10, there is shown an inner view (FIG. 9) and outer view (FIG. 10) of the first and second shell portions 110, 120 after being formed and, as appropriate, trimmed. LEDs 90, 100 are not shown thereon for clarity. As shown, first shell portion 110 has a curved region 112 and a neck 114, with the annular ring 72 of trace 70 located in the curved region 112 (as well as the LEDs 90) and legs 74, 76 located on neck 114. Also as shown, curved region 112 of the first shell portion 110 is permanently curved simultaneously about two axes, the longitudinal axis X and the transverse Y axis (transverse/orthogonal to the longitudinal axis X). A preferred shape creates a spherical surface (referring to bulb enclosure 40), and more particularly a hemi-spherical surface (referring to shells 110, 120). Another example could be a hyperbolic shape which could resemble a saddle. On the other hand, neck 114 of the first shell portion 110 is permanently curved only about the X axis, in a manner which creates a cylindrical surface.

Embodiments herein advantageously provide a complex, curved shape on whose surface there are points along curved regions 112, 122 where the surface is locally curved simultaneously about two different axes that are orthogonal to one another. In contrast, for example, there are known in the art LEDs attached to flexible substrates that are curved in a cylindrical shape, such as in U.S. Pat. No. 6,580,228 (Chen) at FIG. 2, or U.S. Pat. No. 5,585,783 (Hall) at FIG. 7, but all points on those surface are curved about only one axis, not two. Likewise, other examples known in the art of an LED-bearing flexible surface that is curved about only one axis is a rectangular sheet that has been curled into a teardrop shape (as seen in cross-section) such as in U.S. Pat. No. 7,086,767 (Sidwell) at FIG. 5 or in U.S. Pat. No. 5,585,783 (Hall) at FIG. 6, or arched into a convex or concave bend (Hall '783 patent at FIGS. 8-9).

Similarly, second shell portion 120 has a curved region 122 and a neck 124, with the annular ring 82 of trace 80 located in the curved region 122 (as well as the LEDs 100) and legs 84, 86 located on neck 124. Also as shown, curved region 122 of the second shell portion 120 is permanently curved simultaneously about two axes, the longitudinal axis X' and the transverse Y' axis (transverse/orthogonal to the longitudinal axis X'), in a manner which creates a spherical, and more particularly a hemi-spherical, surface. On the other hand, neck 124 of the second shell portion 120 is permanently curved only about the X' axis, in a manner which creates a cylindrical surface. As used herein, it should be understood that "permanently" curved means that the first and second shell portions 110, 120 do not return to their initial planar shape after cooling and subsequent removal from mandrels 210, 230. However, this is not to say that the plastic material of the first and second shell portions 110, 120 is not reheatable as to flow again, as in the case of a thermoplastic, merely just that the shape of the mandrels 210, 230 is retained after demolding.

During thermoforming with vacuum, or vac-forming, the first and second sheet segments 48, 50 may be understood to be exposed to tensile forces in the direction of draw, thus causing the first and second sheet segments 48, 50 to stretch/elongate and reduce in thickness in this direction, generally with the reduction in thickness being the greatest at the deepest portion of the draw of the first and second sheet segments 48, 50.

While it may be possible for the first and second sheet segments 48, 50 to undergo substantial elongation without breaking, certain materials used for each trace 70, 80 may not exhibit such a similar elongation without breaking. For example, it may be understood that with a trace 70, 80 which consists of metal, particularly a copper etched trace, each trace 70, 80 does not stretch/elongate in similar fashion to the first and second sheet segments 48, 50, and may fracture at a lower percentage of elongation.

Figure 11:
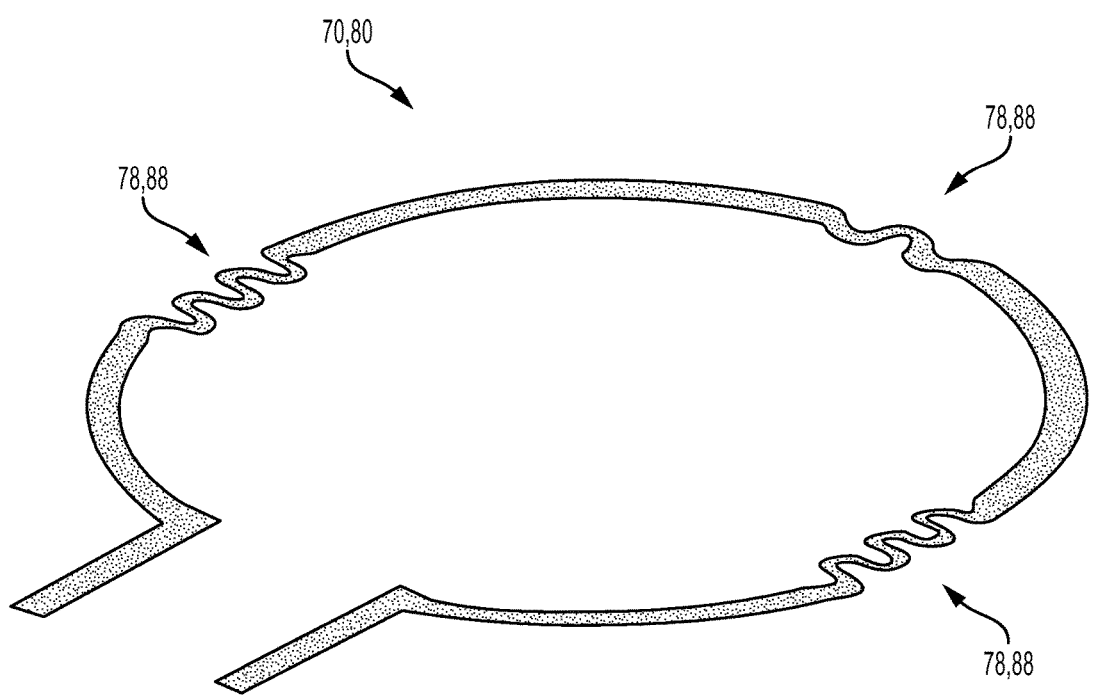
FIG. 11 shows a perspective view of an electrically conductive trace of a sheet segment of FIG. 3 including at least one corrugated/strain relief section.

Referring to FIG. 11, in order to reduce the likelihood of fracture and subsequent inoperation, particularly during forming of the first plastic sheet segment 48 into the first shell portion 110 and forming of the second plastic sheet segment 50 into the second shell portion 80, each trace 70, 80 may include at least one respective corrugated or strain relief section 78, 88, and more particularly a plurality of strain relief sections 78, 88 along a length of the traces 70, 80. As shown, in the unformed sheet, the strain relief sections 78, 88 are each corrugated in a plane. The plane is parallel to each outer surface 52, 54 of the first and second sheet segments 48, 50 and first and second shell portions 110, 120, respectively. Alternative or in addition to use of strain relief sections 78, 88, it is known in the art that traces 70, 80 may be made of sufficient additional thickness or width to accommodate certain changes in shape.

Figure 12:
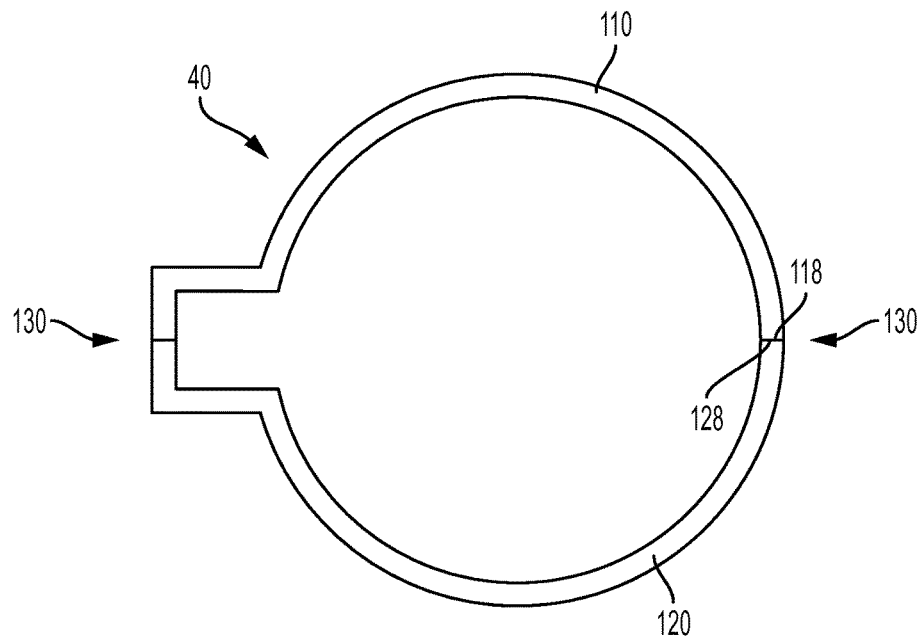
FIG. 12 shows a cross-sectional view of the bulb enclosure of FIG. 1 with the shell portions joined with a butt joint.

Referring now to FIG. 12, as well as FIG. 1, after trimming the first and second shell portions 110, 120 along trimming line 290 (see FIG. 7) as may be required, enclosure 40 may be formed. As shown in FIG. 1, first shell portion 110 and second shell portion 120 (including the first curved region 112 and neck 114 of the first shell portion 110 and the second curved region 122 and neck 124 of the second shell portion 120) are joined in confronting relation into a bulb enclosure 40 defining an interior region 42 therein.

In the case where the first sheet segment 48 and second sheet segment 50 are segments of a single piece of plastic material which are connected by an intermediate connecting web 60, the method of forming enclosure 40 may include folding, during forming the first shell portion 110 and the second shell portion 120 into the bulb enclosure 40, the first shell portion 110 and the second shell portion 120 together with the connecting web 60.

Figure 13:
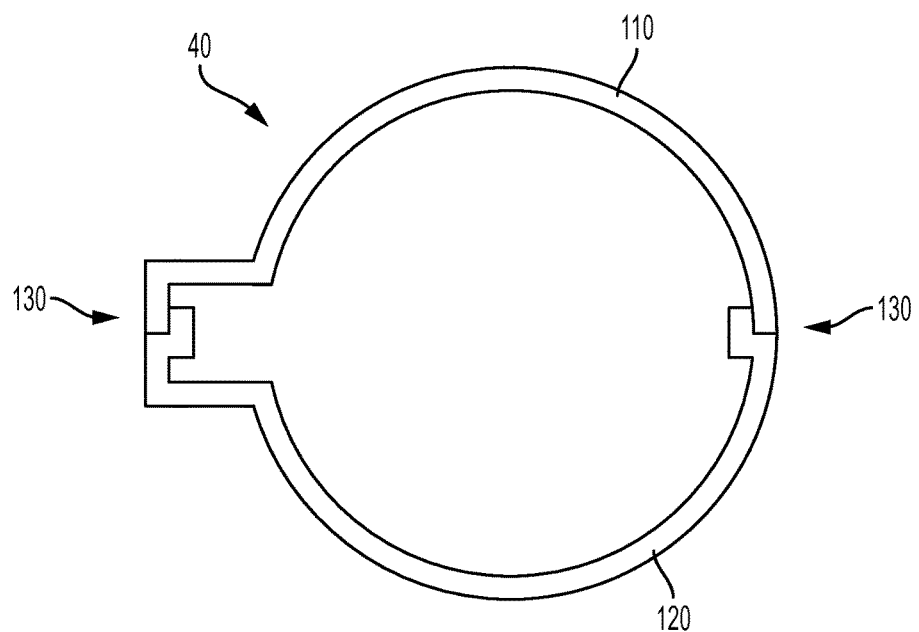
FIG. 13 shows a cross-sectional view of the bulb enclosure of FIG. 1 with the shell portions joined with a lap joint.

A joint 130 may be established between the first and second shell portions 110, 120, particularly along peripheral edge portions 118, 128 thereof, by welding the first and second shell portions 110, 120 together. As shown in FIG. 12, joint 130 is a butt joint. Alternatively, as shown in FIG. 13, joint 130 may be a lap joint.

After forming enclosure 40, base 20 is attached to the first and second necks 114, 124 of the first and second shell portions 110, 120, respectively, particularly by inserting the first and second necks 114, 124 into the base 20 and forming a mechanical or adhesive bond therewith, as may be known in the art.

Figure 14:
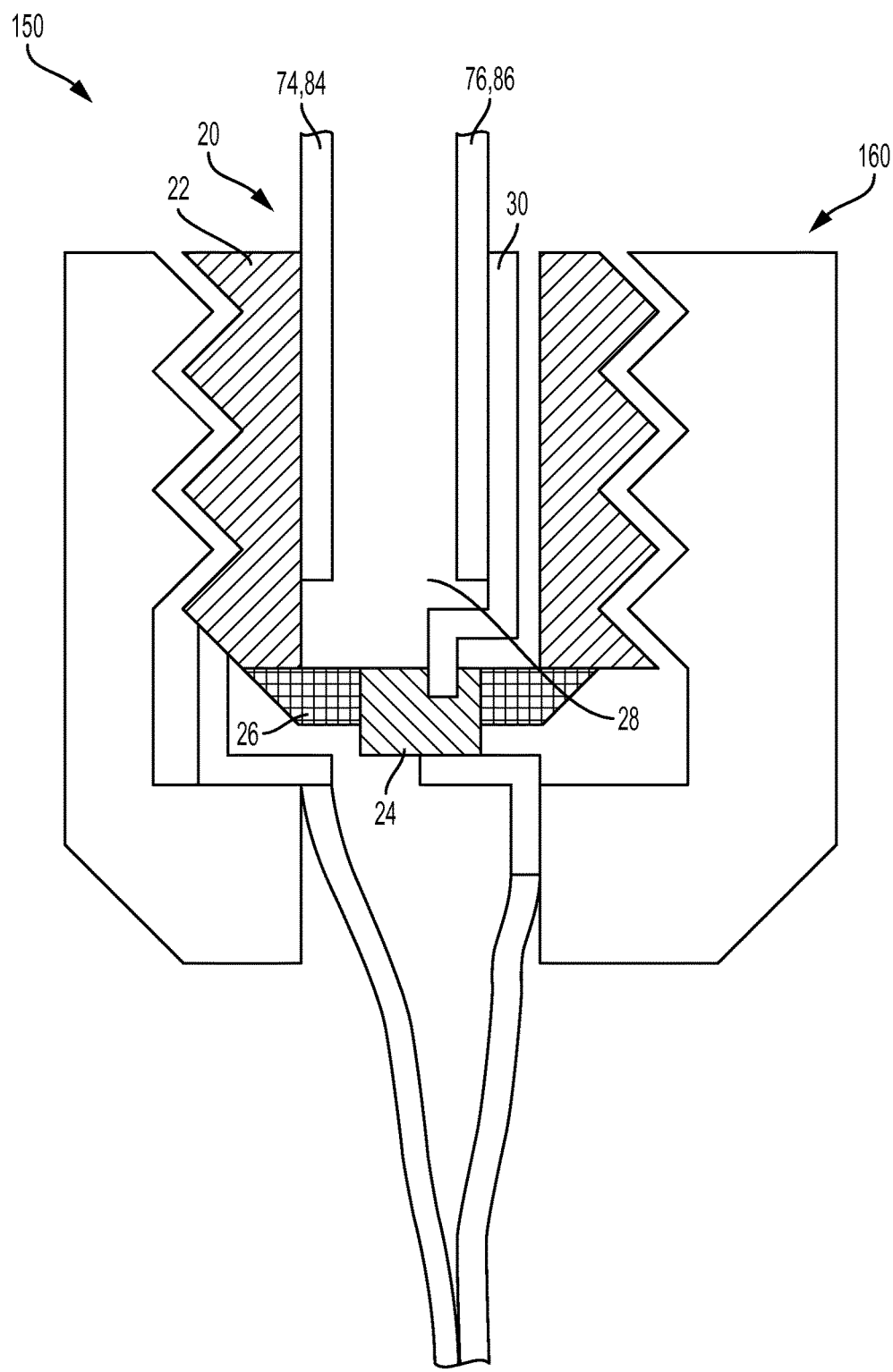
FIG. 14 is a cross-sectional view of the base of the lamp of FIG. 1 in a socket of a lamp fixture and the electrical connections formed therewith.

Referring now to FIG. 14, there is shown the base 20 of lamp 10 inserted in a conventional (known) socket 160 of a lamp fixture 150. The enclosure 40 of lamp 10 has been removed for clarity, except for legs 74, 76 of trace 70, and legs 84, 86 of trace 80.

As show, base 20 may comprise an externally threaded electrically conductive cylindrical sleeve 22 and an electrically conductive cap (or pin) 24, which are electrically isolated from each other by insulator 26. Within the base is a cavity 28 which receives the neck 114, 124 of enclosure 40. Cavity 28 includes an electrical contact 30 coupled to electrically conductive cap 24.

As shown, leg 74 of trace 70, and leg 84 of trace 80, are electrically coupled to sleeve 22, while leg 76 of trace 70, and leg 86 of trace 80, are electrically coupled to cap 24 to complete an electrical circuit within socket 160 for lamp 10 to receive power from a power source.

As such, the present disclosure provides a method of manufacturing a lamp 10 comprising forming at least one first electrically conductive trace 70 on a first sheet segment 48, wherein the first sheet segment is a plastics material; forming at least one second electrically conductive trace 80 on a second sheet segment 50, wherein the second sheet segment is a plastics material; placing a first plurality of solid-state light sources 90 on the first sheet segment 48 such that each of the solid-state light sources of the first plurality of solid-state light sources 90 is in electrical communication with the at least one first electrically conductive trace 70 of the first sheet segment 48, wherein the first plurality of solid-state light sources 90 is a first plurality of light-emitting diodes, and wherein the first plurality of light-emitting diodes each comprise at least one light-emitting chip 94; placing a second plurality of solid-state light sources 100 on the second sheet segment 50 such that each of the solid-state light sources of the second plurality of solid-state light sources 100 is in electrical communication with the at least one second electrically conductive trace 80 of the second sheet segment 50, wherein the second plurality of solid-state light sources 100 is a second plurality of light-emitting diodes, and wherein the second plurality of light-emitting diodes each comprise at least one light-emitting chip 94; forming the first sheet segment 48 into a first shell portion 110 after forming the at least one first electrically conductive trace 70 on the first sheet segment 48 and after placing the first plurality of solid-state light sources 90 on the first sheet segment 48, wherein the at least one first electrically conductive trace 70 and the first plurality of solid-state light sources 90 are located on a first curved region 112 of the first shell portion 110; forming the second sheet segment 50 into a second shell portion 120 after forming the at least one second electrically conductive trace 80 on the second sheet segment 50 and after placing the second plurality of solid-state light sources 100 on the second sheet segment 50, wherein the at least one second electrically conductive trace 80 and the second plurality of solid-state light sources 100 are located on a second curved region 122 of the second shell portion 120; and joining the first shell portion 110 and the second shell portion 120, including the first curved region 112 of the first shell portion 110 and the second curved region 122 of the second shell portion 120, in confronting relation into a bulb enclosure 40 defining an interior region 42 therein.

The first curved region 112 of the first shell portion 110 may be permanently curved simultaneously about two axes X, Y when forming the first sheet segment 48 into the first shell portion 110; and the second curved region 122 of the second shell portion 120 may be permanently curved simultaneously about two axes X', Y' when forming the second sheet segment 50 into the second shell portion 120. Furthermore, the two axes X, Y used to form the first sheet segment 48 into the first shell portion 110 are orthogonal to one another; and the two axes X', Y' used to form the second sheet segment 50 into the second shell portion 120 are orthogonal to one another. Furthermore, the first curved region 112 of the first shell portion 110 may include a hemi-spherical surface; and the second curved region 122 of the second shell portion 120 may include a hemi-spherical surface.

The method of manufacturing the lamp 10 may further comprise forming the first shell portion 110 with a first neck 114, wherein the at least one first electrically conductive trace 70 is located on the first neck 114 of the first shell portion 110; forming the second shell portion 120 with a second neck 124, wherein the at least one second electrically conductive trace 80 is located on the second neck 124 of the second shell portion 120; and joining the first shell portion 110 and the second shell portion 120 further includes joining the first neck 114 of the first shell portion 110 and the second neck 124 of the second shell portion 120 in confronting relation.

The method of manufacturing the lamp 10 may further comprise attaching a lamp base 20 to the first and second necks 114, 124 of the first and second shell portions 110, 120, respectively, of the bulb enclosure 40, wherein the lamp base 20 is configured to be inserted into a conventional socket 160 of a lamp fixture 150.

The method of manufacturing the lamp 10 may further comprise at least one of heating the first sheet segment 48 before forming the first sheet segment 48 into the first shell portion 110; and heating the second sheet segment 50 before forming the second sheet segment 50 into the second shell portion 120.

The method of manufacturing the lamp 10 may further comprise at least one of cooling the first shell portion 110 to retain a formed shape of the first shell portion 110 after forming the first sheet segment 48 into the first shell portion 110; and cooling the second shell portion 120 to retain a formed shape of the second shell portion 120 after forming the second sheet segment 50 into a second shell portion 120.

The method of manufacturing the lamp 10 may further comprise at least one of pre-stretching the first sheet segment 48 with vacuum before forming the first sheet segment 48 into the first shell portion 110; and pre-stretching the second sheet segment 50 with vacuum before forming the second sheet segment 50 into the second shell portion 120.

The method of manufacturing the lamp 10 may further comprise at least one of forming the first sheet segment 48 into the first shell portion 110 on a first male mandrel 210; and forming the second sheet segment 50 into the second shell portion 120 on the first male mandrel 210 or a second male mandrel 230.

The method of manufacturing the lamp 10 may further comprise at least one of forming the first sheet segment 48 into the first shell portion 110 on the first male mandrel 210 further includes applying vacuum through the first male mandrel 210 to pull the first sheet segment 48 onto a first shell forming surface 212 of the first male mandrel 210; and forming the second sheet segment 50 into the second shell portion 120 on the first or second male mandrel 210, 230 further includes applying vacuum through the first or second male mandrel 210, 230 to pull the second sheet segment 120 onto the first shell forming surface 212 of the first male mandrel 210 or a second shell forming surface 232 of the second male mandrel 230, respectively.

The method of manufacturing the lamp 10 may further comprise at least one of: forming the first sheet segment 48 into the first shell portion 110 on the first male mandrel 210 further includes applying positive air pressure towards the first male mandrel 210 to push the first sheet segment 48 onto a first shell forming surface 212 of the first male mandrel 210; and forming the second sheet segment 50 into the second shell portion 120 on the first or second male mandrel 210, 230 further includes applying positive air pressure towards the first or second male mandrel 210, 230 to push the second sheet segment 50 onto the first shell forming surface 212 of the first male mandrel 210 or a second shell forming surface 232 of the second male mandrel 230, respectively.

The method of manufacturing the lamp 10 may further comprise joining the first shell portion 110 and the second shell portion 120 at a joint 130, wherein the joint 130 comprises at least one of a butt joint and a lap joint.

The method of manufacturing the lamp 10 may further comprise joining the first shell portion 110 and the second shell portion 120 at a connecting web 60, and folding, during forming the first shell portion 110 and the second shell portion 120 into the bulb enclosure 40, the first shell portion 110 and the second shell portion 120 together with the connecting web 60.

While a preferred embodiment of the present disclosure has been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present disclosure. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present disclosure is/are used.

Those skilled in the art will recognize, or be able to ascertain using no more than routine experimentation, many equivalents to the specific embodiments of the disclosure described herein. It is, therefore, to be understood that the foregoing embodiments are presented by way of example only and that, within the scope of the appended claims and equivalents thereto, the disclosure may be practiced otherwise than as specifically described and claimed. The present disclosure is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

All definitions, as defined and used herein, should be understood to control over dictionary definitions, definitions in documents incorporated by reference, and/or ordinary meanings of the defined terms. The indefinite articles "a" and "an," as used herein in the specification and in the claims, unless clearly indicated to the contrary, are understood to mean "at least one." The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified, unless clearly indicated to the contrary.

An abstract is submitted herewith. It is pointed out that this abstract is being provided to comply with the rule requiring an abstract that will allow examiners and other searchers to quickly ascertain the general subject matter of the technical disclosure. It is submitted with the understanding that it will not be used to interpret or limit the scope or meaning of the claims, as set forth in the rules of the U.S. Patent and Trademark Office.

The following non-limiting reference numerals are used in the specification.

10 lamp
20 lamp base
22 base sleeve
24 base cap
26 base insulator
28 cavity
30 electrical contact
40 bulb enclosure
42 bulb enclosure interior (volume) region
48 first sheet segment
50 second sheet segment
52 first sheet segment outer surface
54 second sheet segment outer surface
56 first sheet segment inner surface
58 second sheet segment inner surface
60 connecting web/hinge
70 first electrically conductive trace
72 trace head (ring) portion
74 trace neck (leg) portion
76 trace neck (leg) portion
78 corrugated/strain relief section
80 second electrically conductive trace
82 trace head (ring) portion
84 trace neck (leg) portion
86 trace neck (leg) portion
88 corrugated/strain relief section
90 solid state light sources (LEDs)
92 LED submount
94 LED chip
96 LED optical encapsulant
98 LED lens
100 solid state light sources (LEDs)
110 first shell portion
112 curved region
114 neck
118 peripheral edge portion
120 second shell portion
122 curved region 124 neck
128 peripheral edge portion
130 joint
150 lamp fixture
160 socket
200 mold
210 male forming mandrel (mold core)
212 mandrel forming surface
214 mandrel body
216 internal chamber
218 vacuum source
220 forming box
222 forming cavity
224 vacuum/pressure source
230 male forming mandrel (mold core)
232 mandrel forming surface
250 clamping frame
254 recess
260 female forming cavity
262 cavity forming surface
280 female forming cavity
282 cavity forming surface
290 trimming line

What is claimed is:

1. A method of manufacturing a lamp (10) comprising:
forming a first electrically conductive trace (70) on a first sheet segment (48), wherein the first sheet segment is a plastics material;
forming a second electrically conductive trace (80) on a second sheet segment (50), wherein the second sheet segment is a plastics material;
placing a first plurality of solid-state light sources (90) on the first sheet segment (48) such that each of the solid-state light sources of the first plurality of solid-state light sources (90) is in electrical communication with the first electrically conductive trace (70), wherein the first plurality of solid-state light sources (90) is a first plurality of light-emitting diodes, and wherein the first plurality of light-emitting diodes each comprise at least one light-emitting chip (94);
placing a second plurality of solid-state light sources (100) on the second sheet segment (50) such that each of the solid-state light sources of the second plurality of solid-state light sources (100) is in electrical communication with the second electrically conductive trace (80), wherein the second plurality of solid-state light sources (100) is a second plurality of light-emitting diodes, and wherein the second plurality of light-emitting diodes each comprise at least one light-emitting chip (94);
forming the first sheet segment (48) into a first shell portion (110) after forming the first electrically conductive trace (70) and after placing the first plurality of solid-state light sources (90) on the first sheet segment (48), wherein the first electrically conductive trace (70) and the first plurality of solid-state light sources (90) are located on a first curved region (112) of the first shell portion (110);
forming the second sheet segment (50) into a second shell portion (120) after forming the second electrically conductive trace (80) on the second sheet segment (50) and after placing the second plurality of solid-state light sources (100) on the second sheet segment (50), wherein the second electrically conductive trace (80) and the second plurality of solid-state light sources (100) are located on a second curved region (122) of the second shell portion (120); and
joining the first shell portion (110) and the second shell portion (120), including the first curved region (112) of the first shell portion (110) and the second curved region (122) of the second shell portion (120), in confronting relation into a bulb enclosure (40) defining an interior region (42) therein.

2. The method of claim 1 wherein:
the first curved region (112) of the first shell portion (110) is permanently curved simultaneously about two axes (X, Y) when forming the first sheet segment (48) into the first shell portion (110); and
the second curved region (122) of the second shell portion (120) is permanently curved simultaneously about two axes (X', Y') when forming the second sheet segment (50) into the second shell portion (120).

3. The method of claim 2 wherein:
the two axes (X, Y) used to form the first sheet segment (48) into the first shell portion (110) are orthogonal to one another; and
the two axes (X', Y') used to form the second sheet segment (50) into the second shell portion (120) are orthogonal to one another.

4. The method of claim 2 wherein:
the first curved region (112) of the first shell portion (110) comprises a hemi-spherical surface; and
the second curved region (122) of the second shell portion (120) comprises a hemi-spherical surface.

5. The method of claim 1 further comprising:
forming the first shell portion (110) with a first neck (114), wherein the first electrically conductive trace (70) is located on the first neck (114) of the first shell portion (110);
forming the second shell portion (120) with a second neck (124), wherein the second electrically conductive trace (80) is located on the second neck (124) of the second shell portion (120); and
joining the first shell portion (110) and the second shell portion (120) further includes joining the first neck (114) of the first shell portion (110) and the second neck (124) of the second shell portion (120) in confronting relation.

6. The method of claim 5 further comprising:
attaching a lamp base (20) to the first and second necks (114, 124) of the first and second shell portions (110, 120), respectively, of the bulb enclosure (40), wherein the lamp base (20) is configured to be inserted into a conventional socket (160) of a lamp fixture (150).

7. The method of claim 1 further comprising at least one of:
heating the first sheet segment (48) before forming the first sheet segment (48) into the first shell portion (110); and
heating the second sheet segment (50) before forming the second sheet segment (50) into the second shell portion (120).

8. The method of claim 7 further comprising at least one of:
cooling the first shell portion (110) to retain a formed shape of the first shell portion (110) after forming the first sheet segment (48) into the first shell portion (110); and
cooling the second shell portion (120) to retain a formed shape of the second shell portion (120) after forming the second sheet segment (50) into a second shell portion (120).

9. The method of claim 1 further comprising at least one of:

pre-stretching the first sheet segment (48) with vacuum before forming the first sheet segment (48) into the first shell portion (110); and pre-stretching the second sheet segment (50) with vacuum before forming the second sheet segment (50) into the second shell portion (120).

10. The method of claim 1 further comprising at least one of:

forming the first sheet segment (48) into the first shell portion (110) on a first male mandrel (210); and forming the second sheet segment (50) into the second shell portion (120) on the first male mandrel (210) or a second male mandrel (230).

11. The method of claim 10 further comprising at least one of:

forming the first sheet segment (48) into the first shell portion (110) on the first male mandrel (210) further includes applying vacuum through the first male mandrel (210) to pull the first sheet segment (48) onto a first shell forming surface (212) of the first male mandrel (210); and forming the second sheet segment (50) into the second shell portion (120) on the first or second male mandrel (210, 230) further includes applying vacuum through the first or second male mandrel (210, 230) to pull the second sheet segment (120) onto the first shell forming surface (212) of the first male mandrel (210) or a second shell forming surface (232) of the second male mandrel (230), respectively.

12. The method of claim 10 further comprising at least one of:

forming the first sheet segment (48) into the first shell portion (110) on the first male mandrel (210) further includes applying positive air pressure towards the first male mandrel (210) to push the first sheet segment (48) onto a first shell forming surface (212) of the first male mandrel (210); and forming the second sheet segment (50) into the second shell portion (120) on the first or second male mandrel (210, 230) further includes applying positive air pressure towards the first or second male mandrel (210, 230) to push the second sheet segment (50) onto the first shell forming surface (212) of the first male mandrel (210) or a second shell forming surface (232) of the second male mandrel (230), respectively.

13. The method of claim 1 further comprising at least one of:

the first electrically conductive trace (70) is formed by etching, printing or laminating; and the second electrically conductive trace (80) is formed by etching, printing or laminating.

14. The method of claim 1 further comprising at least one of:

the first electrically conductive trace (70) is corrugated in a plane; and the second electrically conductive trace (80) is corrugated in a plane.

15. The method of claim 1 wherein:

the bulb enclosure 40 has an outer surface (52, 54);

the first plurality of solid-state light sources (90) on the first sheet segment (48) are on the outer surface (52) of the bulb enclosure (40); and the second plurality of solid-state light sources (100) on the second sheet segment (50) are on the outer surface (54) of the bulb enclosure (40).

16. The method of claim 1 wherein:

the bulb enclosure (40) has an enclosure shape corresponding to an A-series lamp.

17. The method of claim 1 further comprising:

joining the first shell portion (110) and the second shell portion (120) at a joint (130), wherein the joint (130) comprises at least one of a butt joint and a lap joint.

18. The method of claim 1 further comprising:

joining the first shell portion (110) and the second shell portion (120) at a connecting web (60), and folding, during forming the first shell portion (110) and the second shell portion (120) into the bulb enclosure (40), the first shell portion (110) and the second shell portion (120) together with the connecting web (60).

19. The method of claim 1 wherein:

the first sheet segment (48) and the second sheet segment (50) are segments of a single sheet formed of a plastic composition.

20. The method of claim 10 further comprising at least one of:

fixturing the first sheet segment (48) such that the first plurality of solid state light sources (90) is received into a first cavity (222) which does not include a mold forming surface; and fixturing the second sheet segment (50) such that the second plurality of solid state light sources (100) is received into the first cavity or a second cavity (222) which does not include a mold forming surface.

* * * * *